US011716888B2

(12) United States Patent
Tang et al.

(10) Patent No.: US 11,716,888 B2
(45) Date of Patent: Aug. 1, 2023

(54) DISPLAY SUBSTRATE COMPRISING SCATTERING STRUCTURE FORMED IN ANODE AND INCLUDING PLURALITY OF MUTUALLY STAGGERED GROOVES, METHOD FOR PREPARING THE SAME, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Guoqiang Tang, Beijing (CN); Yao Hu, Beijing (CN); Yangpeng Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 170 days.

(21) Appl. No.: 16/760,866

(22) PCT Filed: Oct. 24, 2019

(86) PCT No.: PCT/CN2019/113012
§ 371 (c)(1),
(2) Date: Apr. 30, 2020

(87) PCT Pub. No.: WO2020/140565
PCT Pub. Date: Jul. 9, 2020

(65) Prior Publication Data
US 2021/0217827 A1 Jul. 15, 2021

(30) Foreign Application Priority Data
Jan. 2, 2019 (CN) .......................... 201910001232.1

(51) Int. Cl.
*H10K 59/35* (2023.01)
*H10K 50/84* (2023.01)
(Continued)

(52) U.S. Cl.
CPC .......... *H10K 59/353* (2023.02); *H10K 50/84* (2023.02); *H10K 50/854* (2023.02); *H10K 59/38* (2023.02); *H10K 71/00* (2023.02)

(58) Field of Classification Search
CPC ............ H01L 51/5275; H01L 51/5253; H01L 51/5268; H01L 51/56; H01L 27/3218;
(Continued)

(56) References Cited

U.S. PATENT DOCUMENTS

2005/0029538 A1 2/2005 Choi et al.
2007/0200492 A1* 8/2007 Cok ..................... H01L 51/5268
313/506
(Continued)

FOREIGN PATENT DOCUMENTS

CN 1849847 A 10/2006
CN 101071183 A 11/2007
(Continued)

OTHER PUBLICATIONS

Won Hoe Koo et al. Light extraction from organic light-emitting diodes enhanced by spontaneously formed buckles. Nature Photonics, [s. l.], v. 4, n. 4, p. 222-226, 2010. DOI 10.1038/nphoton.2010.7 (Year: 2010).*
(Continued)

Primary Examiner — Matthew E. Gordon
(74) Attorney, Agent, or Firm — McCoy Russell LLP

(57) ABSTRACT

The present disclosure provides a display substrate, a method for preparing the same, and a display device. The display substrate includes a planarization layer located on a base substrate and a first electrode layer located on the
(Continued)

planarization layer, a side of the planarization layer away from the base substrate includes a scattering structure, the first electrode layer is located on the scattering structure, and a thickness of the first electrode layer is substantially identical.

15 Claims, 5 Drawing Sheets

(51) Int. Cl.
  *H10K 50/854* (2023.01)
  *H10K 59/38* (2023.01)
  *H10K 71/00* (2023.01)
(58) Field of Classification Search
  CPC .... H01L 27/322; H10K 50/84; H10K 50/854; H10K 59/353; H10K 59/38; H10K 59/87; H10K 59/877; H10K 71/00; H10K 71/40; H10K 71/421; H10K 71/441
  USPC .......................................................... 257/40
  See application file for complete search history.

(56) References Cited

U.S. PATENT DOCUMENTS

| | | | |
|---|---|---|---|
| 2011/0254440 A1 | 10/2011 | Minoura et al. | |
| 2012/0228670 A1 | 9/2012 | Saito | |
| 2016/0327695 A1* | 11/2016 | Masuyama | ........... B29C 33/424 |
| 2016/0363812 A1 | 12/2016 | Li | |
| 2018/0097202 A1* | 4/2018 | Forrest | ................ H01L 51/5212 |

FOREIGN PATENT DOCUMENTS

| | | | |
|---|---|---|---|
| CN | 102313208 A | 1/2012 |
| CN | 102683513 A | 9/2012 |
| CN | 203859154 A | 10/2014 |
| CN | 104330915 A | 2/2015 |
| CN | 105810718 A | 7/2016 |
| CN | 109728197 A | 5/2019 |

OTHER PUBLICATIONS

Koo, W. et al., "Light extraction from organic light-emitting diodes enhance by spontaneously formed buckles," Nature Photonics, vol. 4, No. 4, Feb. 21, 2010, 5 pages.
State Intellectual Property Office of the People's Republic of China, Office Action and Search Report Issued in Application No. 201910001232.1, dated Nov. 6, 2019, 12 pages. (Submitted with Partial Translation).
State Intellectual Property Office of the People's Republic of China, Office Action and Search Report Issued in Application No. 201910001232.1, dated Apr. 21, 2020, 12 pages (Submitted with Partial Translation).
ISA China National Intellectual Property Administration, International Search Report Issued in Application No. PCT/CN2019/113012, dated Feb. 6, 2020, WIPO, 15 pages. (Submitted with Partial Translation).

* cited by examiner

US 11,716,888 B2

DISPLAY SUBSTRATE COMPRISING SCATTERING STRUCTURE FORMED IN ANODE AND INCLUDING PLURALITY OF MUTUALLY STAGGERED GROOVES, METHOD FOR PREPARING THE SAME, AND DISPLAY DEVICE

CROSS-REFERENCE TO RELATED APPLICATION

This application is the U.S. national phase of PCT Application No. PCT/CN2019/113012 filed on Oct. 24, 2019, which claims a priority to Chinese Patent Application No. 201910001232.1 filed on Jan. 2, 2019, the disclosures of which are incorporated in their entirety by reference herein.

TECHNICAL FIELD

The present disclosure relates to the field of display technology, in particular, to a display substrate, a method for preparing the same and a display device.

BACKGROUND

The color separation phenomenon of color filters refers to a phenomenon that when light incident from a color filter (CF) of a display substrate is reflected by pixels of different colors, the incident light is scattered due to the difference in tilt angles of different pixels.

SUMMARY

According to a first aspect, an embodiment of the present disclosure provides a display substrate, including a base substrate and a plurality of sub-pixels located on one side of the base substrate, in which at least one of the plurality of sub-pixels includes a first electrode layer that is configured to scatter incident light irradiated onto the first electrode layer.

Optionally, the display substrate further includes a planarization layer located between the base substrate and the first electrode layer, a side of the planarization layer away from the base substrate includes a scattering structure, and a shape of the first electrode layer is substantially the same as a shape of the scattering structure.

Optionally, a thickness of the first electrode layer is substantially identical.

Optionally, the scattering structure includes a plurality of grooves formed in at least a part of region on the side of the planarization layer away from the base substrate.

Optionally, the grooves include a plurality of mutually staggered grooves arranged along a first direction and along a second direction, the grooves are arranged along the first direction at equal intervals, the grooves are arranged along the second direction at equal intervals, and the first direction and the second direction are different directions parallel to the base substrate.

Optionally, a distance between two adjacent grooves is not less than a wavelength of red light.

Optionally, the first direction and the second direction are perpendicular to each other.

Optionally, a cross-sectional shape of each groove in a direction perpendicular to the display substrate is a circular arc, a parabola, a triangle, or a rectangle.

Optionally, the plurality of sub-pixels includes a red sub-pixel, a green sub-pixel, and a blue sub-pixel, and red, green, and blue light respectively reflected by anodes of the red sub-pixel, the green sub-pixel, and the blue sub-pixel are capable of being scattered relatively uniformly in all directions.

Optionally, the display substrate further includes an electroluminescent layer located on the first electrode layer and a second electrode layer located on the electroluminescent layer, and a thickness of the electroluminescent layer is substantially identical.

Optionally, the display substrate further includes an encapsulation layer and a color filter arranged on the encapsulation layer.

According to a second aspect, an embodiment of the present disclosure further provides a display device including any one of the above display substrate.

According to a third aspect, an embodiment of the present disclosure further provides a method for preparing a display substrate, including: forming a plurality of sub-pixels on a base substrate, in which at least one of the plurality of sub-pixels comprises a first electrode layer that is configured to scatter incident light irradiated onto the first electrode layer.

Optionally, the forming the plurality of sub-pixels on the base substrate includes: forming a planarization layer on the base substrate; forming a scattering structure on the planarization layer; and forming a first electrode layer on the scattering structure, a shape of the first electrode layer being substantially same as a shape of the scattering structure, and a thickness of the first electrode layer being substantially identical.

Optionally, the forming the scattering structure on the planarization layer includes: exposing the planarization layer by a first dual laser interference, in which interference fringes of the first dual laser interference are arranged along a first direction; exposing the planarization layer by a second dual laser interference, in which interference fringes of the second dual laser interference are arranged along a second direction, and the first direction and the second direction are different directions parallel to the base substrate; and developing an exposed region of the planarization layer to form a plurality of grooves on a surface of the planarization layer away from the base substrate.

Optionally, during the exposing by the first dual laser interference and the exposing by the second dual laser interference, a distance between adjacent interference fringes of the dual laser is not less than a wavelength of red light.

Optionally, the exposing the planarization layer by the second dual laser interference includes: rotating the base substrate by 90 degrees in a plane where the base substrate is located, keeping a direction of an exposure light source unchanged, and exposing the planarization layer by a dual laser interference.

Optionally, after the forming the first electrode layer on the scattering structure, the method further includes: forming an electroluminescent layer on the first electrode layer, a thickness of the electroluminescent layer being substantially identical; and forming a second electrode layer on the electroluminescent layer.

BRIEF DESCRIPTION OF THE DRAWINGS

In order to illustrate the technical solutions of the present disclosure in a clearer manner, the drawings desired for the embodiments of the present disclosure will be described briefly hereinafter. Obviously, the following drawings merely relate to some embodiments of the present disclosure. Based on these drawings, a person skilled in the art may obtain the other drawings without any creative effort.

DETAILED DESCRIPTION

The technical solutions in the embodiments of the present disclosure will be described hereinafter in conjunction with the drawings in the embodiments of the present disclosure in a clear and complete manner. Obviously, the following embodiments relate to a part of, rather than all of, the embodiments of the present disclosure. Based on these embodiments, a person skilled in the art may, without any creative effort, obtain the other embodiments, which also fall within the scope of the present disclosure.

Figure 1:
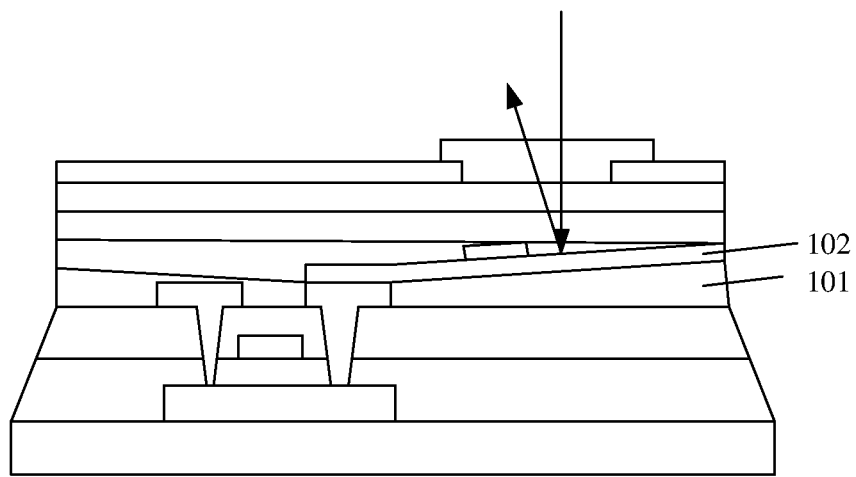
FIG. 1 is a schematic view showing the principle of generating the color separation phenomenon.
Figure 2:
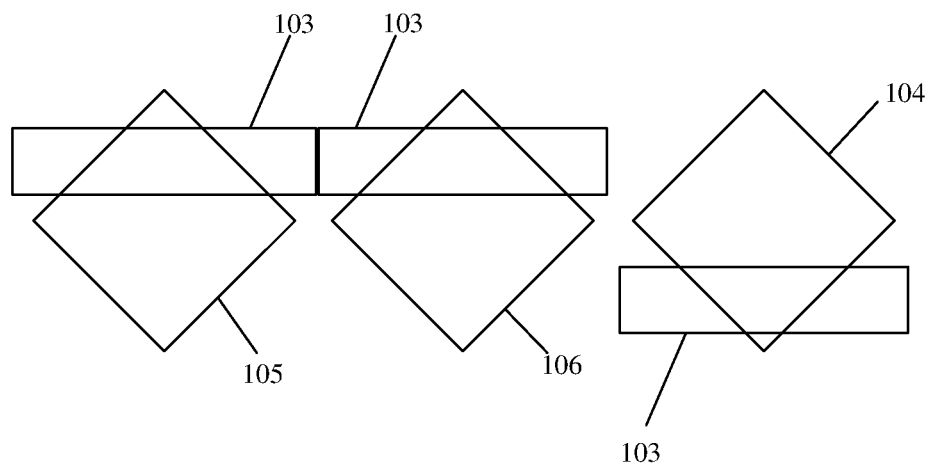
FIG. 2 is a schematic view showing a trace of a source/drain electrode in the related art.

Specifically, as shown in FIG. 1, when a hole is punched in the planarization layer (PLN) 101, the thickness of the planarization layer 101 around the hole will change, so that the planarization layer 101 will form a slope, thereby causing the anode 102 formed on the basis of the planarization layer 101 to tilt. In addition, as shown in FIG. 2, the trace of the source/drain electrode 103 (S/D) and other factors may also cause the anodes corresponding to pixels of different colors to tilt.

In general, since the aperture ratio of the blue pixel 104 is greater than those of the red pixel 105 and the green pixel 106, the typographic order is also different. This causes the tilt direction of the blue pixel 104 to be opposite to those of the red pixel 105 and the green pixel 106, and thus the directions of the light reflected by the anode of the red pixel 105 and the anode of the green pixel 106 are opposite to the direction of the light reflected by the anode of the blue pixel 104. For example, in FIG. 1, when the red and green lights are reflected to the left of incident light, the blue light is reflected to the right of incident light.

The phenomenon that lights of different colors are reflected differently is called the color separation phenomenon.

In one or more embodiments, the present disclosure provides a display substrate.

As shown in FIG. 3 to FIG. 7, in one embodiment, the display substrate includes a planarization layer (PLN) 210 located on the base substrate and a first electrode layer 220 located on the planarization layer 210.

It should be understood that the planarization layer 210 may not be directly formed on the base substrate, and there may be some other functional film layers between the planarization layer 210 and the base substrate. The existing and possible display substrates can be referred for the details, and are not further limited and described herein.

A side of the planarization layer 210 away from the base substrate includes a scattering structure, the first electrode layer 220 is located on the scattering structure, and a thickness of the first electrode layer 220 is uniform anywhere. It can also be understood that a thickness of the first electrode layer 220 is substantially identical.

Since the first electrode layer 220 is located on the scattering structure and the thickness of the first electrode layer 220 is substantially identical, a shape of the first electrode layer 220 is also substantially same as the shape of the scattering structure, so that the light is scattered by the first electrode layer 220.

It should be understood that "substantially same" in this Example means that the edge of the first electrode layer 220 and the edge of the scattering structure can be considered to be correspondingly parallel under the condition of ignoring the slight differences that may exist due to factors such as production process.

It should be understood that "uniform" and "substantially identical" in this Example mean that the thickness of the first electrode layer 220 can be considered to be identical under the condition of ignoring the slight differences that may exist due to factors such as production process, in which the deviation is ±0.1%, optionally the deviation is ±0.01%.

In this way, since the shape of the first electrode layer 220 is substantially same as the shape of the scattering structure, when light is incident on the first electrode layer 220 from a color filter on encapsulation (COE), the existence of the scattering structure makes the shape of the first electrode layer 220 to be substantially same as the scattering structure, so that incident light can be scattered on the first electrode layer 220. In this way, the red, green, and blue light respectively reflected by the anodes of pixels of different colors, for example, pixels of three colors of red, green, and blue, can be scattered relatively uniformly in all directions, thereby being capable of effectively reducing or eliminating color separation phenomenon.

In a specific embodiment, the scattering structure includes a plurality of grooves 211 formed in at least a part of region in the side of the planarization layer 210 away from the base substrate.

In this embodiment, the scattering structure includes a plurality of grooves 211. In practice, the grooves 211 may be formed only in a part of region of the planarization layer 210. For example, according to design experience, the grooves 211 are only formed in a part of region where incident light dispersion phenomenon is severe, so as to form a scattering structure.

In a preferred embodiment, grooves 211 may be formed in the entire region of a side of the planarization layer 210 away from the base substrate, that is, two ends of each groove 211 respectively extend to the edge of the planarization layer 210, thereby being capable of reducing or eliminating the color separation phenomenon that may occur in various regions of the display substrate.

The groove 211 includes a plurality of grooves 211 formed in a first direction and a plurality of grooves 211 formed in a second direction, in which the first direction and the second direction are different directions parallel to the base substrate. In this way, the grooves formed in the first direction and the grooves formed in the second direction are staggered.

In the first direction and the second direction, the grooves 211 formed in the first direction are arranged at equal intervals, and the grooves 211 formed in the second direction are arranged at equal intervals.

Figure 3:
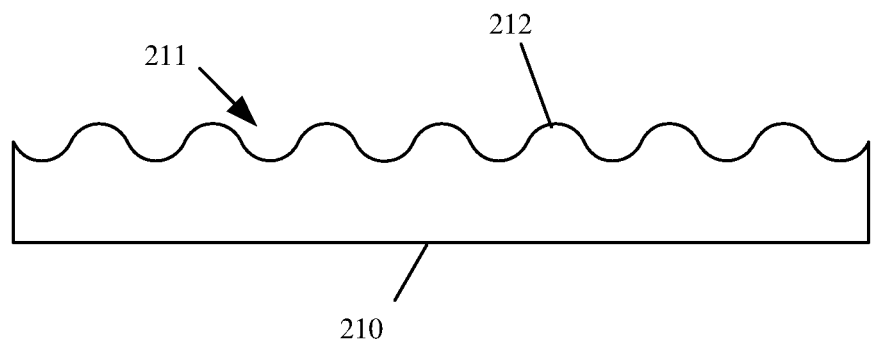
FIG. 3 is a structural schematic view showing a planarization layer in a display substrate according to some embodiments of the present disclosure.
Figure 4:
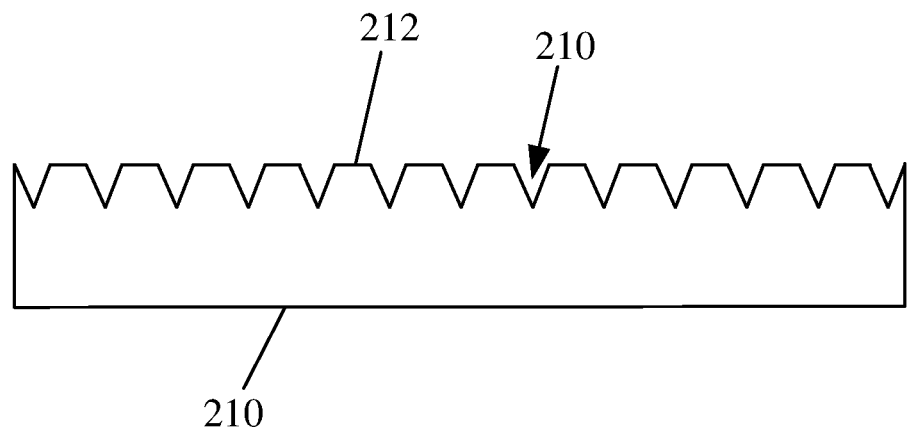
FIG. 4 is a structural schematic view showing another planarization layer in a display substrate according to some embodiments of the present disclosure.
Figure 5:
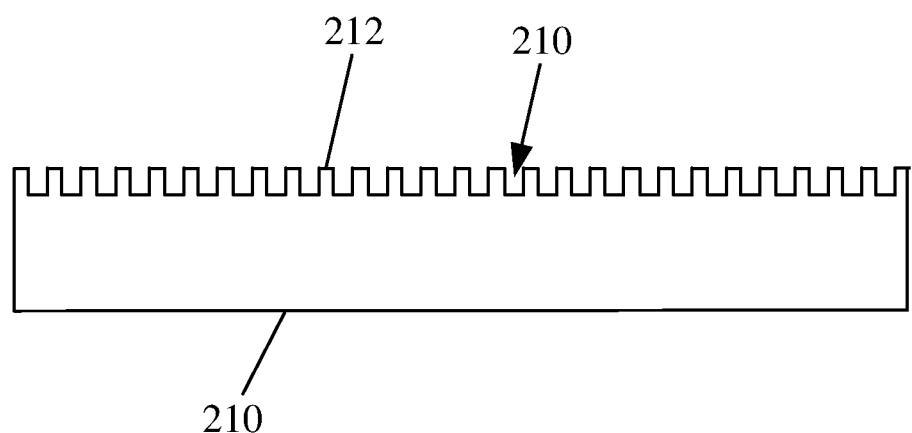
FIG. 5 is a structural schematic view showing a still another planarization layer in a display substrate according to some embodiments of the present disclosure.

As shown in FIGS. 3 to 5, the cross-sectional shape of each groove 211 in this embodiment can be changed, for example, it can be various shapes, such as a circular arc, a parabola, a triangle, and a rectangle.

Figure 6:
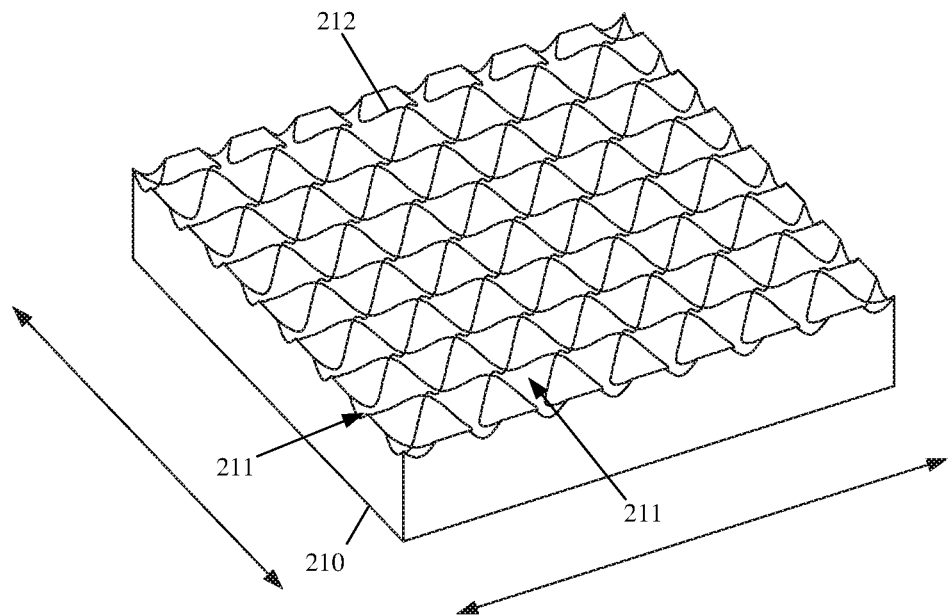
FIG. 6 is another perspective view of FIG. 3.
Figure 7:
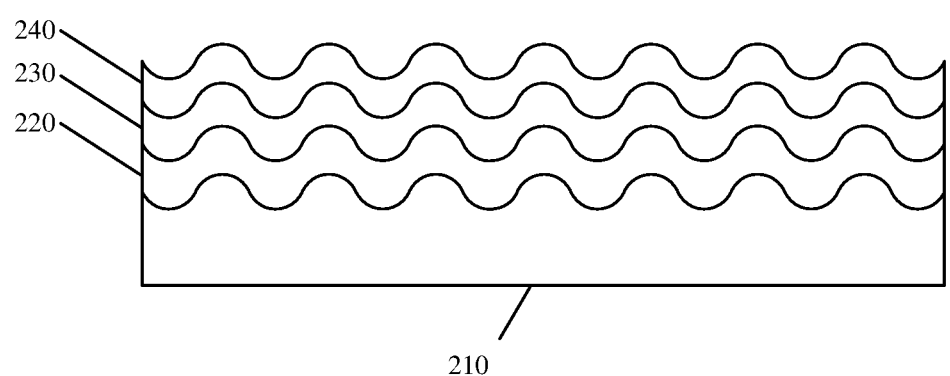
FIG. 7 is a structural schematic view showing a display substrate according to some embodiments of the present disclosure.

In a specific embodiment, as shown in FIG. 3 and FIG. 6, the shape of the grooves 211 is generally wavy. When viewed from a side, the structure of grooves is substantially continuous sinusoidal or wavy.

As shown in FIG. 6, when the staggered grooves 211 are formed on the planarization layer 210, the remaining part of the surface of the planarization layer 210 forms a plurality of convex structures 212, and the structure of the staggered grooves 211 makes the surface of the planarization layer 210 to form convex structures 212 arranged in an array.

As shown in FIG. 6, FIG. 6 is another perspective view of the view shown in FIG. 3. When the surface of the planarization layer 210 is provided with a plurality of grooves 211 in the first direction and the second direction, respectively, a plurality of convex structures 212 will be formed on the surface of the planarization layer 210.

The directions indicated by the two double arrows in FIG. 6 as the first direction and the second direction are taken as an example for illustration. On the planarization layer 210, a plurality of grooves 211 are provided in the first direction and the second direction, respectively. In the planarization layer 210, the thickness of the region where the groove 211 is not provided is greater than the thickness of the region where the groove 211 is provided. In this way, the region where there is no groove 211 remains, thereby forming a convex structure 212.

Figure 10:
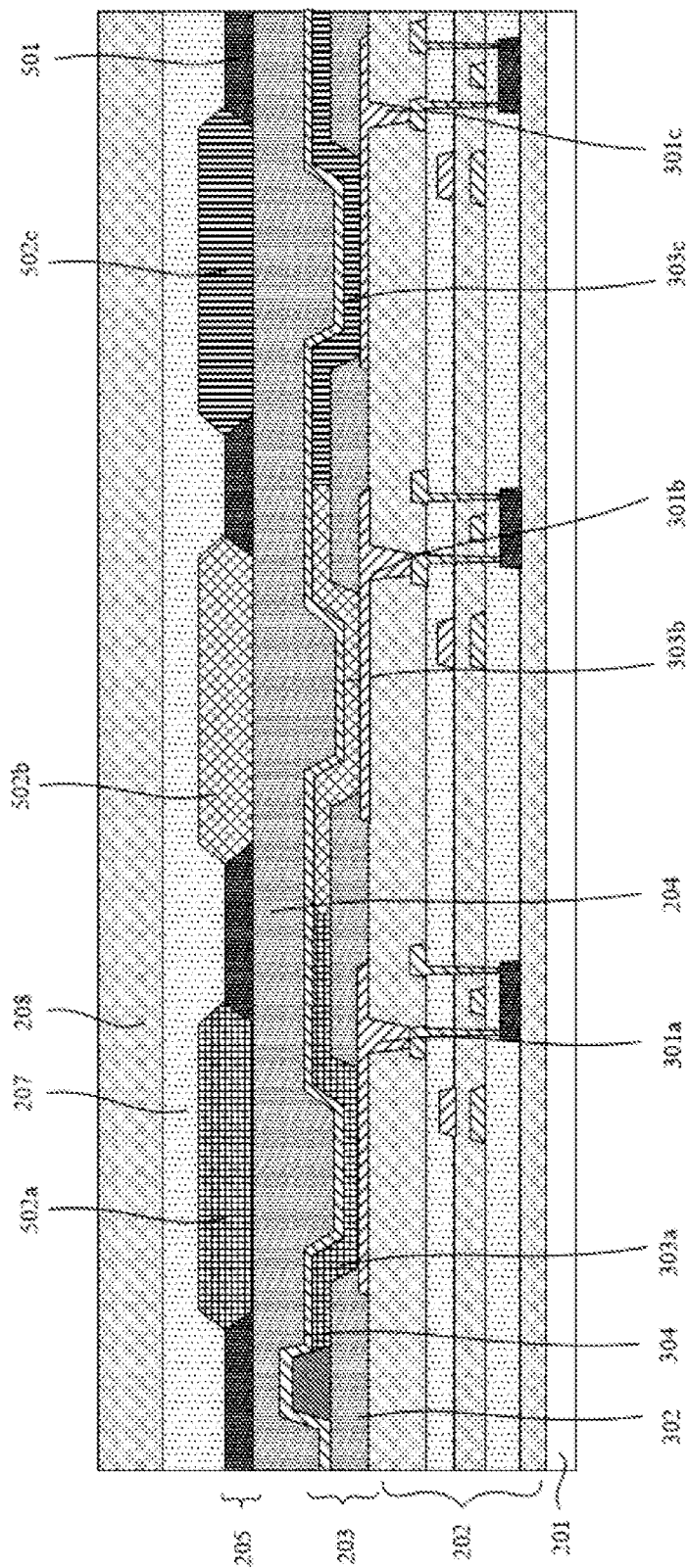
FIG. 10 is a structural schematic view showing a display substrate according to another embodiment of the present disclosure.

As shown in FIG. 10, the display substrate includes a base substrate 201; an array substrate 202; a light-emitting element 203 which includes a definition layer 302, a first electrode layer 220 including a anode 301a, 301b, 301c, a second electrode layer 240 including a cathode 304 and a light-emitting layer 230, which includes a light-emitting layer 303a of a red sub-pixel, a light-emitting layer 303b of a green sub-pixel and a light-emitting layer 303c of a blue sub-pixel, between the first electrode layer 220 and the second electrode layer 240; a planarization layer 204 covering the a light-emitting element 203; a black matrix layer 205 which includes a black matrix 501 and a color filter layer 502a, 502b, 502c; a planarization layer 207 covering the black matrix layer 205 and a cover plate 208. The plurality of sub pixels includes a red sub-pixel, a green sub-pixel and a blue sub-pixel. The red light, green light and blue light respectively reflected by the anodes (301a, 301b, 301c) of the red sub-pixel, green sub-pixel and blue sub-pixel are capable of being scattered uniformly in all directions due to the scattering structure.

Further, the distance between two adjacent grooves 211 is not less than the wavelength of red light.

The convex structure 212 can diffuse the incident light, and the distance between two adjacent grooves 211 is not less than the wavelength of the red light. It should be understood that in visible light, the wavelength of red light is the longest. As long as the distance between two adjacent grooves is not less than the wavelength of red light, the incident light can be prevented from being diffracted from one groove 211 into another groove 211.

Here, the distance between the grooves 211 means the distance between the same positions of different grooves 211, for example, the distance between the lowest points of two adjacent grooves 211, or the distance between the rightmost point of each groove in two adjacent grooves shown in FIGS. 3 to 6.

The wavelength of red light is about 620 to 760 nm, in which the end of the long wave in the visible spectrum has a wavelength of about 625 to 740 nm. During implementation, there may be some differences in the red light wavelengths corresponding to the red pixels in different display substrates. For different display substrates, it is possible to prevent the incident light from diffracting at the convex structures 212 by controlling the distance between the convex structures 212 to be greater than the corresponding red light wavelength. When the scattered light cannot be diffracted, it will be eliminated after multiple reflections, thereby further reducing or eliminating the color separation phenomenon.

Further, the display substrate further includes an electroluminescent layer 230 (EL) formed on the first electrode layer 220 and a second electrode layer 240 formed on the electroluminescent layer 230, and the thickness of the electroluminescent layer 230 is substantially identical.

For materials of the electroluminescent layer 230 and the second electrode layer 240, reference may be made to the existing electroluminescent layer 230 and the second electrode layer 240, which are not further limited and described herein.

Since the electroluminescent layer 230 is formed on the first electrode layer 220 and the thickness of the electroluminescent layer 230 is substantially identical, the shape of the electroluminescent layer 230 is similar to that of the first electrode layer 220. Correspondingly, the shape of the side of the second electrode layer 240 facing the first electrode layer 220 is also substantially same as that of the first electrode layer 220, and each concave-convex structure thereof substantially corresponds to the concave-convex structure on the scattering structure.

In this way, in the direction perpendicular to the base substrate, the distance between the first electrode layer 220 and the second electrode layer 240 is substantially identical, thereby allowing the length of the formed microcavity structure to be uniform, and also ensuring the performance, such as color cast, color gamut, efficiency, and brightness, of the electroluminescent layer 230 not to be greatly affected.

In one or more embodiments, the present disclosure provides a display device, including any one of the above display substrates. The technical solutions of the present embodiment include all the technical solutions of the above embodiment, so that at least the above technical effects can be achieved, which is not described herein again.

Further, the display device may include, but is not limited to, at least one of a mobile phone, a tablet computer, an e-book reader, an MP3 player, an MP4 player, a digital camera, a laptop portable computer, a car computer, a desktop computer, a set top box, a smart TV, and a wearable device.

In one or more embodiments, the present disclosure provides a method for preparing a display substrate.

Figure 8:
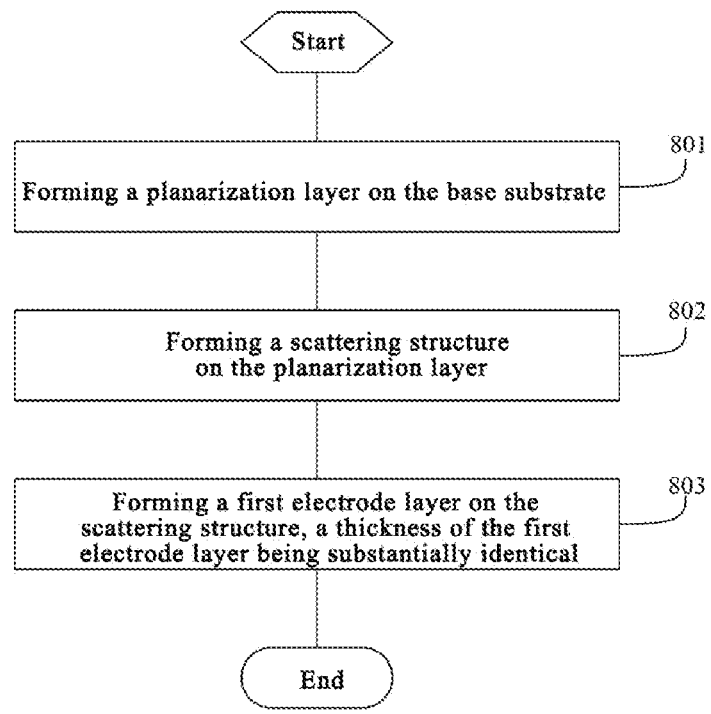
FIG. 8 is a flowchart showing a method for preparing a display substrate according to other embodiments of the present disclosure.

As shown in FIG. 8, the method for preparing the display substrate includes: step 801: forming a planarization layer 210 on the base substrate; and forming a first electrode layer 220 on the planarization layer 210.

The above step 801 may refer to the existing process of forming the planarization layer 210, and before forming the planarization layer 210, some other functional film layers may be formed, that is, the planarization layer 210 may not be directly formed on the surface of the base substrate, but some other functional film layers are first formed on the base substrate, and then a planarization layer 210 is formed on these functional film layers. These functional film layers include, but are not limited to, a gate layer, a gate insulating layer, an active layer, a source/drain electrode layer, and other functional layers. Reference can be made to the existing possible display substrates, which are not specifically limited or described here.

Further, the method for preparing the display substrate further includes: step 802: forming a scattering structure on the planarization layer 210.

The above step of forming the first electrode layer 220 on the planarization layer 210 specifically includes: step 803: forming a first electrode layer 220 on the scattering structure, a thickness of the first electrode layer 220 being substantially identical.

The main difference between the first electrode layer 220 formed in the existing display substrate and the first electrode layer 220 formed in this Example lies in that the first electrode layer 220 in this Example is formed on the scattering structure, so that the shape of the formed first electrode layer 220 is also substantially same as that of the scattering structure.

In this way, when light is incident on the first electrode layer 220 from a color filter on encapsulation, the existence of the scattering structure makes incident light to be scattered on the first electrode layer 220. In this way, the red, green, and blue light respectively reflected by the anodes of pixels of three colors of red, green, and blue, can be scattered relatively uniformly in all directions, thereby being capable of effectively reducing or eliminating color separation phenomenon.

Further, the above step 802 includes: exposing the planarization layer 210 by a first dual laser interference; exposing the planarization layer 210 by a second dual laser interference; and developing an exposed region of the planarization layer 210.

Exposing by a dual laser interference means a process of exposing by the interference fringes formed after two light sources pass through the grating. Since the light emitted by the two light sources is constructive or destructive at different positions, the exposing by the dual laser interference is capable of forming spaced interference fringes, and then forming the corresponding structure after the exposed region is developed.

In this embodiment, the interference fringe of the exposing by the first dual laser interference is along the first direction with respect to the display substrate, and the interference fringe of the exposing by the second dual laser interference is along the second direction with respect to the display substrate, in which the first direction and the second direction are different directions parallel to the base substrate.

Figure 9:
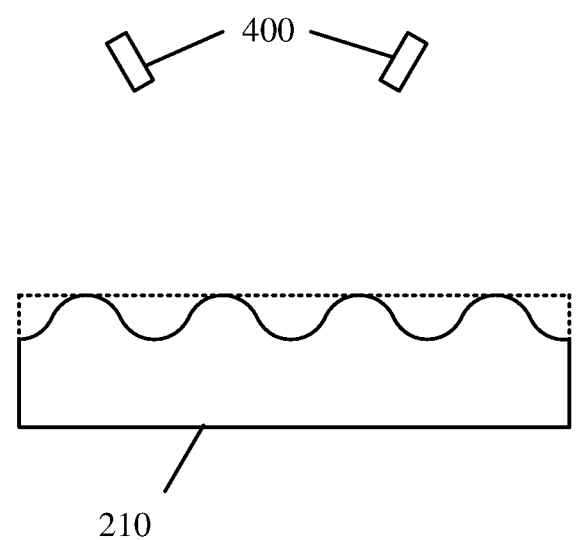
FIG. 9 is a schematic view showing an exposing process by a dual light source according to other embodiments of the present disclosure.

As shown in FIG. 6, the two interference exposures actually form a grid-shaped exposure region. As shown in FIG. 9, after the exposure, the exposure region is developed, so that the remaining portion of the surface of the planarization layer 210 form a plurality of convex structures 212 arranged in an array, in which the dashed boundary above the planarization layer 210 in FIG. 9 represents the original boundary of the planarization layer 210, and the solid line boundary represents the boundary after the exposure and development processes.

Further, during the exposing by the first dual laser interference and the exposing by the second dual laser interference, a distance between two adjacent interference fringes of the dual laser is not less than the wavelength of red light.

The distance between the interference fringes can be achieved by controlling the wavelength of the light source, selecting a grating with different grating constants, adjusting the angle of the laser source, and changing the distance between the laser source and the base substrate, in which the grating constant refers to the distance between two adjacent slits of the grating.

Since the distance between the interference fringes corresponds to the distance between the planarization layer 210 structures eliminated during development, this distance is also equal to the distance between two adjacent grooves 211 in the first direction or the second direction. Therefore, the diffraction of the incident light at the convex structure 212 formed after the groove is formed can be avoid by controlling the distance between two adjacent interference fringes to be less than the wavelength of red light, that is, making the distance between two adjacent grooves 211 to be not less than the wavelength of red light.

In this embodiment, as long as the first direction and the second direction are not in the same or opposite directions, convex structures arranged in an array are formed as the scattering structure. In a specific embodiment, the first direction and the second direction are substantially perpendicular to each other.

The above exposing the planarization layer 210 by the second dual laser interference includes: rotating the base substrate by 90 degrees in a plane where the base substrate is located, keeping a direction of an exposure light source 400 unchanged, and exposing the planarization layer by a dual laser interference.

Since the movement of the exposure light source 400 is relatively inconvenient, during the implementation, after the exposing by the first dual laser interference, the base substrate can be rotated by 90 degrees clockwise or counterclockwise in the plane where the base substrate is located, and then the direction of the exposure light source 400 is not changed, followed by the exposing by the second dual laser interference. In this way, the interference fringe of the exposing by the first dual laser interference and the interference fringe of the exposing by the second dual laser interference can be made perpendicular to each other, that is, the first direction and the second direction can be made perpendicular to each other.

It should be understood that rotating by 90 degrees and being perpendicular to each other herein means that the angle of rotation is substantially equal to 90 degrees in the case of ignoring possible system errors, so that the first direction and the second direction are as perpendicular to each other as possible.

After the above step 603, the method for preparing the display substrate further includes: forming an electroluminescent layer 230 on the first electrode layer 220, a thickness of the electroluminescent layer 230 being substantially identical; and forming a second electrode layer 240 on the electroluminescent layer 230.

After the first electrode layer 220 is formed, an electroluminescent layer 230 is further formed on the first electrode layer 220. Since the thickness of the formed first electrode layer 220 is substantially identical, the shape of the surface on a side of the first electrode layer 220 away from the planarization layer 210 is also substantially equal to that of the scattering structure. In this way, when the thickness of the electroluminescent layer 230 is substantially identical, the shape of the surface of the electroluminescent layer 230 is substantially same as the shape of the surface of the first electrode layer 220. In this way, after the second electrode layer 240 is formed on the surface of the electroluminescent layer 230, the distance between the formed second electrode layer 240 and the first electrode layer 220 is also substantially identical.

In this way, in the direction perpendicular to the base substrate, the distance between the first electrode layer 220 and the second electrode layer 240 is substantially identical, thereby allowing the length of the formed microcavity structure to be uniform, and also ensuring the performance, such as color cast, color gamut, efficiency, and brightness, of the electroluminescent layer 230 not to be greatly affected.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

The invention claimed is:

1. A display substrate, comprising a base substrate, a plurality of sub-pixels located on one side of the base substrate, and a planarization layer, wherein at least one of the plurality of sub-pixels comprises a first electrode layer that is configured to scatter incident light irradiated onto the first electrode layer, the planarization layer is located between the base substrate and the first electrode layer, a side of the planarization layer away from the base substrate comprises a scattering structure, and a shape of the first electrode layer is substantially the same as a shape of the scattering structure,
   wherein the plurality of sub-pixels comprises a red sub-pixel, a green sub-pixel, and a blue sub-pixel, and red, green, and blue light respectively reflected by the first electrode layer of the red sub-pixel, the green sub-pixel, and the blue sub-pixel are capable of being scattered uniformly in all directions,
   wherein the scattering structure comprises a plurality of grooves formed in at least a part of a region on the side of the planarization layer away from the base substrate, and a side of the plurality of grooves away from the planarization layer is in direct physical contact with the first electrode layer,
   wherein the grooves comprise a plurality of mutually staggered grooves arranged along a first direction and along a second direction, the grooves are arranged along the first direction at equal intervals, the grooves are arranged along the second direction at equal intervals, and the first direction and the second direction are different directions parallel to the base substrate.

2. The display substrate of claim 1, wherein a thickness of the first electrode layer is substantially uniform throughout the entirety of the first electrode layer in a direction perpendicular to the side of the base substrate.

3. The display substrate of claim 1, wherein a distance between two adjacent grooves is not less than a wavelength of red light.

4. The display substrate of claim 1, wherein the first direction and the second direction are perpendicular to each other.

5. The display substrate of claim 1, wherein a cross-sectional shape of each groove in a direction perpendicular to the display substrate is a circular arc, a parabola, a triangle, or a rectangle.

6. The display substrate of claim 1, wherein the display substrate further comprises an electroluminescent layer located on the first electrode layer and a second electrode layer located on the electroluminescent layer, and a thickness of the electroluminescent layer is substantially uniform throughout the entirety of the electroluminescent layer in a direction perpendicular to the side of the base substrate.

7. The display substrate of claim 1, wherein the display substrate further comprises an encapsulation layer and a color filter located on the encapsulation layer.

8. A display device, comprising the display substrate of claim 1.

9. A method for preparing a display substrate, wherein the display substrate comprises a base substrate, a plurality of sub-pixels located on one side of the base substrate, and a planarization layer, wherein at least one of the plurality of sub-pixels comprises a first electrode layer that is configured to scatter incident light irradiated onto the first electrode layer, the planarization layer is located between the base substrate and the first electrode layer, a side of the planarization layer away from the base substrate comprises a scattering structure, and a shape of the first electrode layer is substantially the same as a shape of the scattering structure,
   wherein the plurality of sub-pixels comprises a red sub-pixel, a green sub-pixel, and a blue sub-pixel, and red, green, and blue light respectively reflected by the first electrode layer of the red sub-pixel, the green sub-pixel, and the blue sub-pixel are capable of being scattered uniformly in all directions,
   wherein the scattering structure comprises a plurality of grooves formed in at least a part of a region on the side of the planarization layer away from the base substrate, and a side of the plurality of grooves away from the planarization layer is in direct physical contact with the first electrode layer,
   wherein the grooves comprise a plurality of mutually staggered grooves arranged along a first direction and along a second direction, the grooves are arranged along the first direction at equal intervals, the grooves are arranged along the second direction at equal intervals, and the first direction and the second direction are different directions parallel to the base substrate,
   the method comprises:
      forming a plurality of sub-pixels on a base substrate, wherein at least one of the plurality of sub-pixels comprises a first electrode layer that is configured to scatter incident light irradiated onto the first electrode layer,
      the forming a plurality of sub-pixels on a base substrate comprises:
         forming a planarization layer on the base substrate;
         forming a scattering structure on the planarization layer; and
         forming a first electrode layer on the scattering structure, a shape of the first electrode layer being substantially same as a shape of the scattering structure, and a thickness of the first electrode layer being substantially identical.

10. The method of claim 9, wherein the forming the scattering structure on the planarization layer comprises:
   exposing the planarization layer by a first dual laser interference, wherein interference fringes of the first dual laser interference are arranged along a first direction;
   exposing the planarization layer by a second dual laser interference, wherein interference fringes of the second dual laser interference are arranged along a second direction, and the first direction and the second direction are different directions parallel to the base substrate; and developing an exposed region of the planarization layer to form a plurality of grooves on a surface of the planarization layer away from the base substrate.

11. The method of claim 10, wherein during the exposing by the first dual laser interference and the exposing by the second dual laser interference, a distance between adjacent interference fringes of the dual laser is not less than a wavelength of red light.

12. The method of claim 10, wherein the first direction and the second direction are perpendicular to each other.

13. The method of claim 10, wherein a cross-sectional shape of each groove is a circular arc, a parabola, a triangle, or a rectangle.

14. The method of claim 10, wherein the exposing the planarization layer by the second dual laser interference comprises:

rotating the base substrate by 90 degrees in a plane where the base substrate is located, keeping a direction of an exposure light source unchanged, and exposing the planarization layer by a dual laser interference.

15. The method of claim 9, wherein after the forming the first electrode layer on the scattering structure, the method further comprises:

forming an electroluminescent layer on the first electrode layer, a thickness of the electroluminescent layer being substantially identical; and forming a second electrode layer on the electroluminescent layer.

* * * * *